United States Patent
Nagahara (10) Patent No.: US 9,500,936 B2
(45) Date of Patent: Nov. 22, 2016

(54) LIGHT SOURCE DEVICE, AND OPTICAL ENGINE IN WHICH LIGHT SOURCE DEVICE IS USED

(71) Applicant: NICHIA CORPORATION, Anan-shi, Tokushima (JP)

(72) Inventor: Seiji Nagahara, Yokohama (JP)

(73) Assignee: NICHIA CORPORATION, Anan-shi (JP)

( * ) Notice: Subject to any disclaimer, the term of this patent is extended or adjusted under 35 U.S.C. 154(b) by 165 days.

(21) Appl. No.: 14/303,980

(22) Filed: Jun. 13, 2014

(65) Prior Publication Data

US 2014/0375970 A1     Dec. 25, 2014

(30) Foreign Application Priority Data

Jun. 21, 2013   (JP) ................................ 2013-131201
Jun. 6, 2014    (JP) ................................ 2014-117353

(51) Int. Cl.
| | | |
|---|---|---|
| *G03B 21/16* | (2006.01) | |
| *H04N 9/31* | (2006.01) | |
| *H01S 5/024* | (2006.01) | |
| *G03B 21/20* | (2006.01) | |
| *H01S 5/022* | (2006.01) | |
| *H01S 5/40* | (2006.01) | |

(52) U.S. Cl.
CPC ............ *G03B 21/16* (2013.01); *G03B 21/204* (2013.01); *H01S 5/02469* (2013.01); *H01S 5/02212* (2013.01); *H01S 5/4025* (2013.01); *H04N 9/3144* (2013.01)

(58) Field of Classification Search
CPC .... G03B 21/16; G03B 21/14; H04N 9/3144; F21V 29/00; F21V 29/002; F21V 29/02

USPC ......... 353/57, 58, 60, 61; 362/373; 361/688, 361/697, 703, 711
See application file for complete search history.

(56) References Cited

U.S. PATENT DOCUMENTS

| | | |
|---|---|---|
| 2010/0328632 A1 | 12/2010 | Kurosaki et al. |
| 2012/0092624 A1 | 4/2012 | Oiwa et al. |
| 2012/0182527 A1 | 7/2012 | Enomoto et al. |
| 2012/0327379 A1 | 12/2012 | Enomoto et al. |
| 2013/0057834 A1 | 3/2013 | Yoshida |
| 2013/0114044 A1 | 5/2013 | Inoue et al. |
| 2013/0170204 A1* | 7/2013 | Sasamuro ................. F21V 5/04 362/235 |

FOREIGN PATENT DOCUMENTS

| | | |
|---|---|---|
| JP | 2004-341105 A | 12/2004 |
| JP | 2011-076781 A | 4/2011 |
| JP | 4711154 B | 6/2011 |
| JP | 2012-088451 A | 5/2012 |
| JP | 2012-063488 A | 6/2012 |
| JP | 2012-150229 A | 8/2012 |
| JP | 2013-007966 A | 1/2013 |
| JP | 2013-057702 A | 3/2013 |

* cited by examiner

*Primary Examiner* — William C Dowling
*Assistant Examiner* — Ryan Howard
(74) *Attorney, Agent, or Firm* — Global IP Counselors, LLP (57) ABSTRACT

The present disclosure relates to a light source device. The light source device includes: a semiconductor laser device having a heat dissipation face; a heat dissipation member in contact with a light emission side of the semiconductor laser device out of the heat dissipation face, the heat dissipation member having a window that emits light from the semiconductor laser device, and a wind-blocking tube provided inside the window.

14 Claims, 12 Drawing Sheets

PRIOR ART

Fig. 12A

PRIOR ART

Fig. 12B

LIGHT SOURCE DEVICE, AND OPTICAL ENGINE IN WHICH LIGHT SOURCE DEVICE IS USED

CROSS-REFERENCE TO RELATED APPLICATIONS

This application claims priority to Japanese Patent Application No. 2013-131201 filed on Jun. 21, 2013. The entire disclosure of Japanese Patent Application No. 2013-131201 is hereby incorporated herein by reference.

BACKGROUND

1. Technical Field

The present disclosure relates to a light source device equipped with a high-output light source device constituted by a semiconductor laser device, and more particularly relates to a semiconductor laser light source device equipped with a heat dissipation member (heat sink) on the face where the semiconductor laser light is emitted, wherein the effect of cooling air on the light can be prevented while heat can be dissipated efficiently, and the accumulation of dust on optical parts can be suppressed.

2. Related Art

A conventional projector makes use of a discharge-type lamp, such as a high-pressure mercury vapor lamp or a xenon lamp, but configurations in which a light emitting diode or a semiconductor laser serves as the light source have been proposed because of their superiority in terms of power consumption and environmental burden (for example, JP2012-88451A, JP4711154B, JP2011-76781A, JP2012-63488A, JP2004-341105A, etc.).

In particular, hybrid light source that combine a semiconductor laser device with a phosphor are very promising as new lamp for high-brightness projectors that afford good safety.

In JP4711154B, for example, a projector is disclosed which is constituted by a blue semiconductor laser device and a wheel that includes a phosphor region that absorbs blue light and emits green light, a phosphor region that absorbs blue light and emits red light, and a transparent region with a light diffusing effect. While this wheel is rotated, blue light from the blue semiconductor laser device is converged on the wheel by a lens, and illumination light which is composed of the transmitted blue light and the green light and red light emitted from the phosphors is created.

JP2004-341105A discusses a blue-violet-light excited phosphor wheel coated with a phosphor that emits blue light, a phosphor that emits green light, and a phosphor that emits red light.

To achieve brighter illumination, a high-output excitation light source is necessary, and a structure has been studied in which a plurality of semiconductor laser devices are disposed in the same plane as described in JP2011-76781A. With a structure in which semiconductor laser devices are thus disposed in the same plane, when size is taken into account, the spacing between the semiconductor laser devices must be reduced. This tends to result in the accumulation of the heat from the semiconductor laser devices, which leads to lower light output and a shorter service life. In view of this, a method has been used in which the semiconductor laser devices are brought into contact with a heat dissipation member (heat sink), and the heat is dissipated by a cooling fan.

Figure 12A:
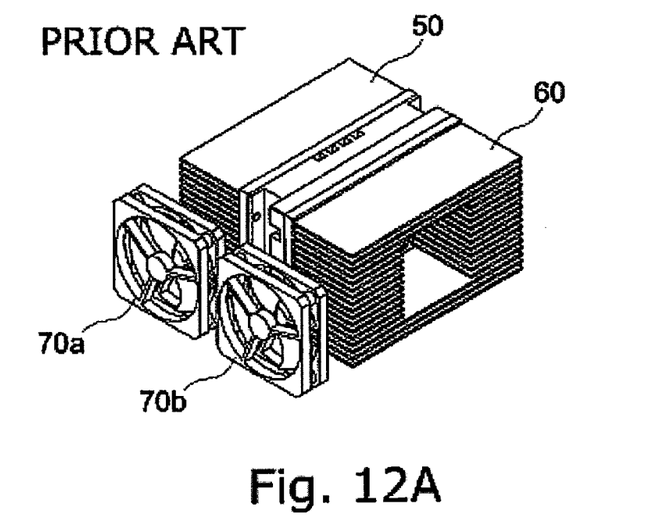
FIG. 12A is an oblique view illustrating how heat is dissipated from a conventional light source device in which a heat dissipation member is formed on the light emission face of a semiconductor laser device.
Figure 12B:
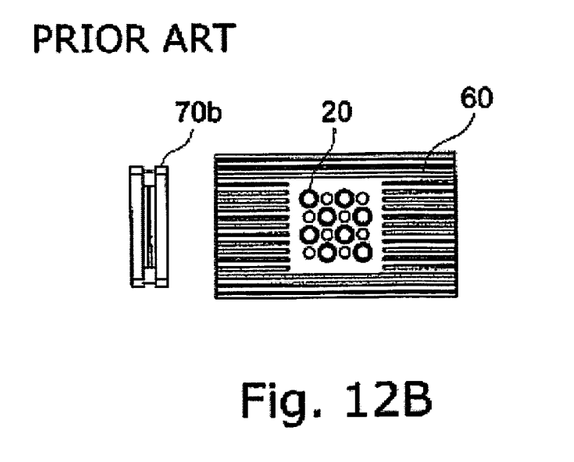
FIG. 12B is a front view of FIG. 12A.

In a method involving the use of a cooling fan, it is good to provide the heat dissipation member on a plurality of faces in order to dissipate the heat more efficiently. For example, as shown in FIGS. 12A and 12B, a light source device in which heat dissipation members 50, 60 are formed on a side of the light emission face of a semiconductor laser device. However, when heat is dissipated by cooling fans 70a, 70b from a light source device such as this, the wind passes over the optical path, and there is the possibility that dust or the like will block the semiconductor laser light, which can lead to flicker.

SUMMARY

The present disclosure relates to a light source device. The light source device includes: a semiconductor laser device having a heat dissipation face; a heat dissipation member in contact with a light emission side of the semiconductor laser device out of the heat dissipation face, the heat dissipation member having a window that emits light from the semiconductor laser device, and a wind-blocking tube provided inside the window.

The present disclosure also relates to optical engines. One optical engine includes: the light source device of the above; a light conversion member that emits light of a different wavelength from the wavelength of the light emitted from the light source device; an optical member that color-mixes the light emitted from the light source device with the light emitted from the light conversion member; a light modulation member that modulates the color-mixed light; a projection member that projects the modulated light; a protection member surrounding an optical path of light from the semiconductor laser device, the light conversion member, the optical member, the light modulation member, and having an opening through which light emitted from the light source device is incident, the opening in the protection member being connected to the light emission side of the wind-blocking tube, and the optical path being sealed from the semiconductor laser device to the projection member.

Another optical engine includes: the light source device of the above; a light conversion member that emits light of a different wavelength from the wavelength of the light emitted from the light source device; an optical member that color-mixes the light emitted from the light source device with the light emitted from the light conversion member; a light modulation member that modulates the color-mixed light; a projection member that projects the modulated light; a protection member surrounding an optical path of light from the semiconductor laser device, the light conversion member, the optical member, the light modulation member, and having the wind-blocking tube of the light source device being part thereof; and the optical path being sealed from the semiconductor laser device to the projection member.

With the present disclosure, a light source device that ensures good heat dissipation for the semiconductor laser device can be effectively cooled while preventing the effect of wind on the emitted light, and in turn the effect of wind from the cooling fan. Also, the entire optical path can be sealed, not just for the light from the semiconductor laser device, but also for the light that passes through the optical engine. Thus, the accumulation of dust on the optical parts can be suppressed. As a result, a light source device and an optical engine can be provided with which there is less deterioration of color purity and/or decrease in the strength of the light passing through the optical engine.

DETAILED DESCRIPTION OF EXEMPLARY EMBODIMENTS

Embodiments for implementing the embodiments of the present disclosure will be described below with reference to the accompanying drawings. The embodiments given below are specific examples of embodying the technological concept of the present disclosure, but these are not the only embodiments possible. Also, the dimensions, materials, shapes, relative layouts, and so forth of the constituent parts discussed in the embodiments are nothing but examples, and are not intended to limit the scope of the present disclosure unless otherwise specified. The sizes and the arrangement relationships of the members in each of drawings are occasionally shown exaggerated for ease of explanation.

Embodiment 1

Figure 1A:
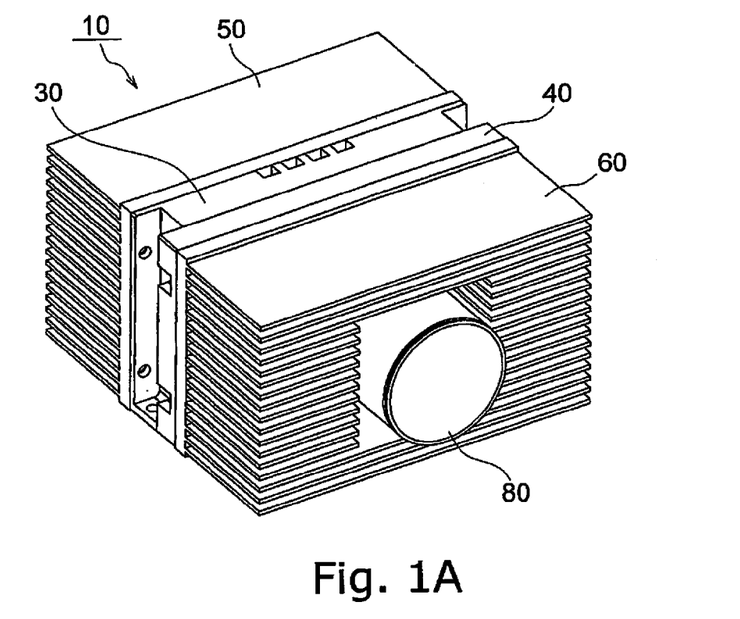
FIG. 1A is a simplified oblique view of the light source device of the present disclosure.
Figure 1B:
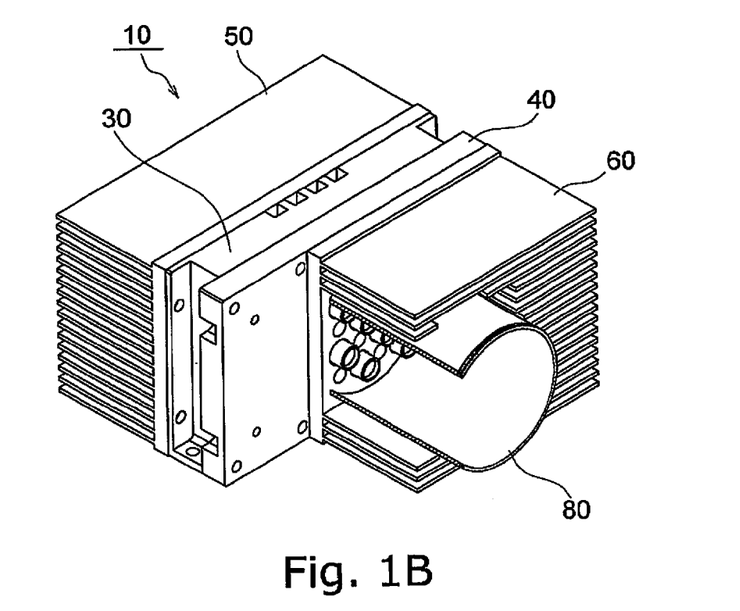
FIG. 1B is a simplified oblique view illustrating the interior, from which part of FIG. 1A has been cut away.
Figure 2A:
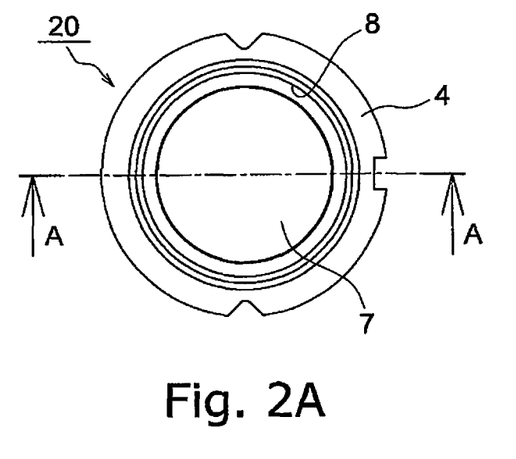
FIG. 2A is a simplified top view of the semiconductor laser device of the present disclosure.
Figure 2B:
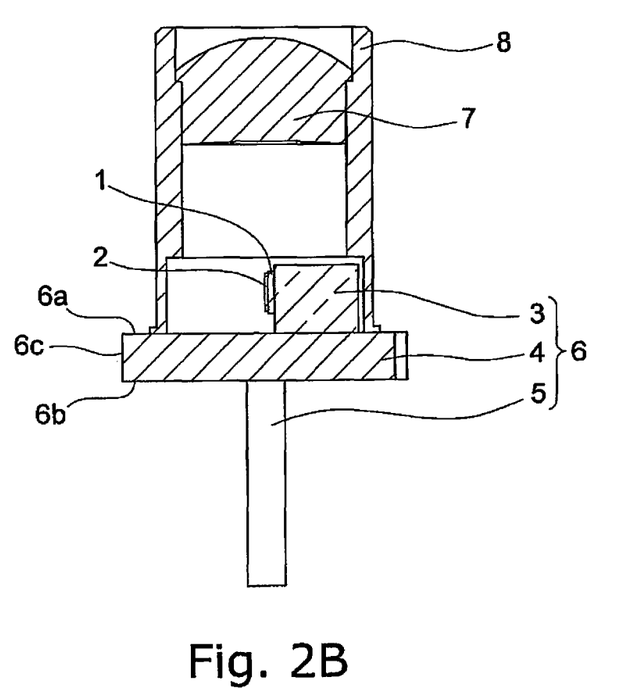
FIG. 2B is a simplified cross section along the A-A line in FIG. 2A.

First, a construction of the light source device will be described. FIG. 1A is a simplified oblique view of the light source device 10, and FIG. 1B is a simplified oblique view illustrating the interior, from which part of FIG. 1A has been cut away. FIG. 2A is a simplified top view of the semiconductor laser device 20, and FIG. 2B is a simplified cross section along the A-A line in FIG. 2A.

In the following discussion, the side on which light is mainly emitted in a direction along the optical axis of the light source device (hereinafter referred to as the "optical axis direction") shall be referred to as ahead or the front face side, and the opposite side as behind or the rear face side.

As shown in FIGS. 1A and 1B, a light source device 10 is mainly configured such that a first support member 30 and a second support member 40 are provided, a second heat dissipation member 50 is connected behind the first support member 30, and a first heat dissipation member 60 is connected ahead of the second support member 40. The first support member 30 supports a plurality of semiconductor laser devices 20 and the second support member 40 are provided ahead of the first support member 30. Thus providing the second heat dissipation member 50 and the first heat dissipation member 60 on the first support member 30 side and the second support member 40 side, respectively, allows heat to be dispersed and pulled from the support members 30 and 40, and improves the heat dissipation performance of the semiconductor laser devices 20. Here, since the semiconductor laser devices are supported by the first support member and the second support member, the part behind the first support member and the part ahead of the second support member serve as heat dissipation faces for the semiconductor laser devices.

If these support members are not provided, the face on the front face side of a stem 6 (shown in FIG. 2B) and the outer surface of a cap 8 will serve as front heat dissipation faces, and the face on the rear face side of the stem 6 will serve as a rear heat dissipation face. If there is just one support member, then when a semiconductor laser element is supported by just the first support member, for example, the part ahead of the first support member will also serve as a heat dissipation face, and a heat dissipation member can be provided to this face. The second heat dissipation member 50 can also be omitted.

The first support member 30 and the second support member 40 may support at least one semiconductor laser device 20, and a plurality of semiconductor laser devices 20 may be supported in a state of being sandwiched between the first support member 30 and the second support member 40.

Furthermore, the first support member 30 and the second support member 40 do not have to be provided in contact with each other, nor do the support members 30 and 40 and the heat dissipation members 50 and 60, and some other member may be interposed between them, such as thermal grease, a heat dissipation sheet, an adhesive agent, or the like.

There are preferably two support members, or there may be three or more, from the standpoint of improving heat dissipation of the semiconductor laser devices 20 and reducing the size of the light source device, there may instead be just one. For instance, if there is one support member, the configuration will be such that the second heat dissipation member 50 is connected behind, and the first heat dissipation member 60 is connected ahead.

The material of the support members can be aluminum, an aluminum alloy, copper, a copper alloy, stainless steel, steel, Super Invar, Kovar, ceramic, resin, or the like. Aluminum or an aluminum alloy is particularly favorable because of its excellent thermal conductivity. Next most preferable is copper or a copper alloy.

The support members may have fins formed on their outer surface.

The first heat dissipation member 60 and the second heat dissipation member 50 are connected to the support members 40 and 30, and are members that promote the dissipation of heat from the support members and, in turn, from the semiconductor laser devices 20. The heat dissipation member is a heat dissipation device or a heat dissipation plate, and preferably has fins so that heat will be dissipated more effectively. Examples of the shape of these fins include a plate shape, a needle shape, a cylindrical shape, and a spiral shape.

The material of the heat dissipation members 50 and 60 can be made of the same materials as the support members.

As shown in FIGS. 2A and 2B, the semiconductor laser devices each have a stem 6. The stem 6 has an element mounting component 3 on which a semiconductor laser element 2 is mounted, a terminal 5 that is electrically connected to the semiconductor laser element 2, and a base 4 that supports the element mounting component 3 on an upper face 6a and exposes and supports the terminal 5 from a lower face 6b side that is contiguous with the upper face 6a through a side face 6c. The base 4 may integrally support the element mounting component 3.

As shown in FIGS. 2A and 2B, the semiconductor laser device 20 comprises an optical part 7 on which light from the semiconductor laser element 2 is incident, and the cap 8 that supports this optical part 7 and seals the semiconductor laser element 2. With this semiconductor laser device 20, the heat dissipation performance is enhanced, which maintains the relative positional relation between the semiconductor laser element 2 and the optical part 7, and this tends to result in superior optical characteristics. In particular, in the case that the semiconductor laser device 20 includes a collimator lens, that is, the optical part 7 is or includes a collimator lens, parallel light can be emitted. This allows the position where the semiconductor laser device 20 is installed in the optical axis direction to be changed without the emitted light being blocked by the first heat dissipation member 60, so there is almost no influence on the optical characteristics of the light source device 10. In other words, it is easy to achieve a layout that gives superior heat dissipation of the semiconductor laser device 20.

Next, a construction of the optical engine in which light source device having the heat dissipation member on a side of the light emission face (i.e., a front side of or ahead of a semiconductor laser device) is installed will be described.

Figure 3A:
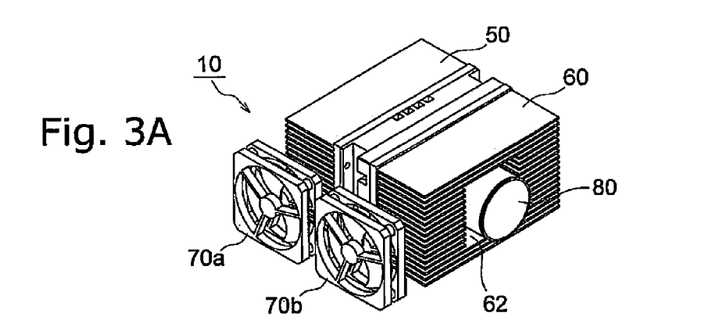
FIG. 3A is an oblique view of an embodiment of the light source device of the present disclosure.
Figure 3B:
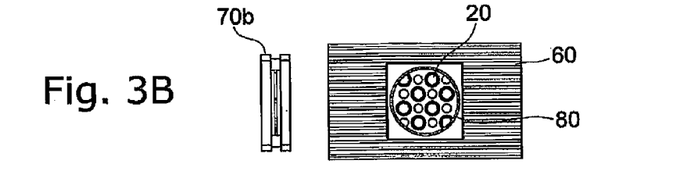
FIG. 3B is a front view of FIG. 3A (as seen from the window side)

FIG. 3A is an oblique view of an embodiment of the light source device 10 of the present disclosure, the first heat dissipation member 60 has a window 62 for passing the light emitted from the light source device. FIG. 3B is a front view of FIG. 3A (as seen from the window side), the light source device 10 has the semiconductor laser devices 20 arranged in an array of 4 lows and 4 columns.

Figure 3C:
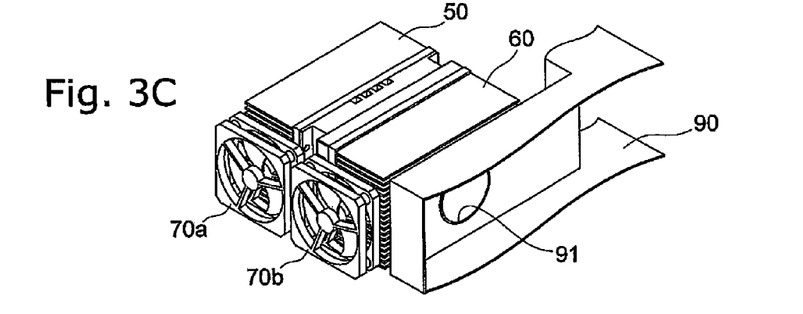
FIG. 3C is an oblique view of an embodiment of the optical engine of the present disclosure.
Figure 5:
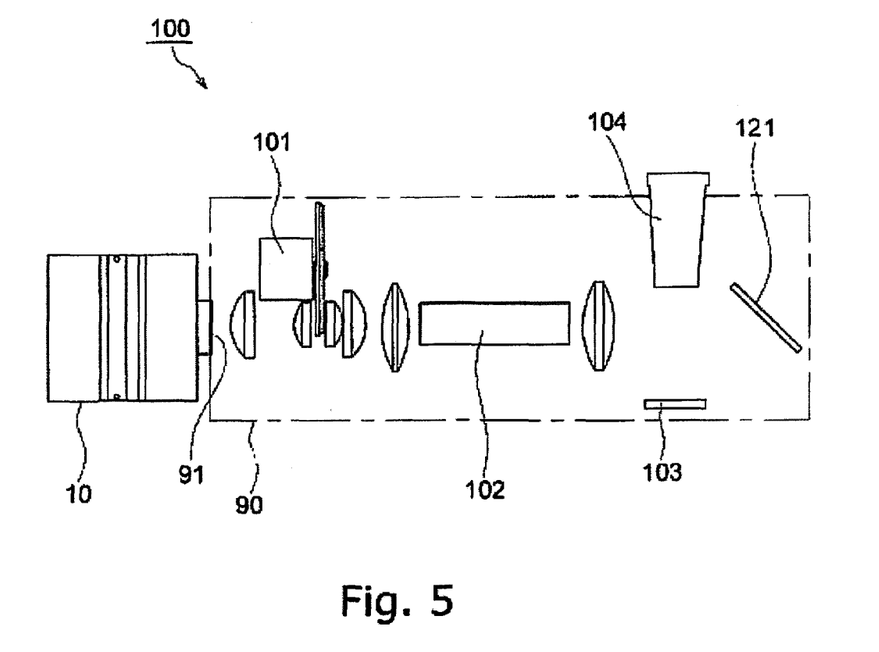
FIG. 5 is a diagram illustrating the structure of the optical engine of the present disclosure.

FIG. 3C is an oblique view of the optical engine in which a light conversion member 101, an optical member 102, a light modulation member 103, a projection member 104, a micro-mirror 121, and such other members are disposed and a protection member 90 is formed for protecting these members (see FIG. 5)

In order to actively dissipate heat from the light source device 10 having heat dissipation members 50, 60 ahead of and behind the semiconductor laser devices 20, a first cooling fan 70b is disposed near the first heat dissipation member 60 (the heat dissipation member on the light emission side), and a second cooling fan 70a is disposed near the second heat dissipation member 50 (the heat dissipation member on the rear face side). This enhances the heat dissipation of the semiconductor laser devices, and allows the semiconductor laser devices to be driven stably for an extended length of time.

A wind-blocking tube 80 is disposed in the window 62 of the first heat dissipation member 60 ahead of the semiconductor laser devices 20. This wind-blocking tube has a hollow structure. The wind-blocking tube 80 is disposed so that the light emitted from the light source device will pass through the hollowing interior of the wind-blocking tube. This structure prevents the light emitted from the semiconductor laser device from being affected by wind, and prevents the influence of wind when the cooling fans 70a and 70b are provided.

The cross sectional shape of the wind-blocking tube 80 can be changed as needed, according to the shape of the first heat dissipation member 60, and the number and layout of the semiconductor laser devices 20.

With this wind-blocking tube 80, as shown in FIGS. 4A to 4D, the cross sectional shape of the outer wall can be that of a circle 80a, an ellipse 80b, a streamlined shape 80c, a polyhedron 80d, or the like. In particular, if the shape is circular, elliptical, or streamlined, there will be less air resistance to the wind from the cooling fans, so heat can be dissipated more efficiently from the heat dissipation members. Wind eddies can also be suppressed. On the other hand, with the polyhedral shape 80d (typified by a square shape), when a plurality of semiconductor laser devices 20 are used, the light emitted from all of these semiconductor laser devices can be surrounded by a wind-blocking tube with the minimum surface area. Accordingly, the window 62 can be smaller, or to put it another way, the surface area of the heat dissipation member 60 can be increased. In addition, since the air resistance can also be reduced, heat dissipation is further increased. If a polyhedral shape is used, the corners may be rounded by chamfering or other such machining.

The shape of the heat dissipation member 60 can be suitably modified according to the outer wall shape of the wind-blocking tube 80.

Figure 4A:
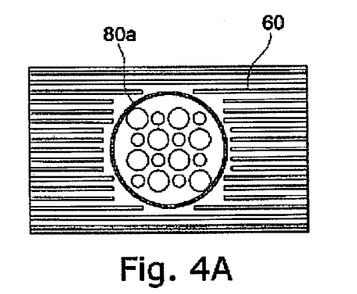
FIGS. 4A to 4D are schematic diagrams illustrating the shape of the wind-blocking tube of the present disclosure.
Figure 4B:
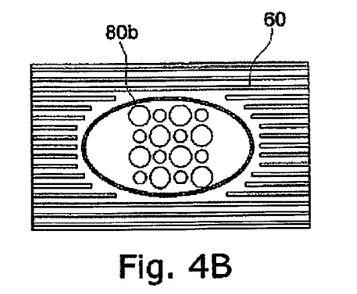
Figure 4C:
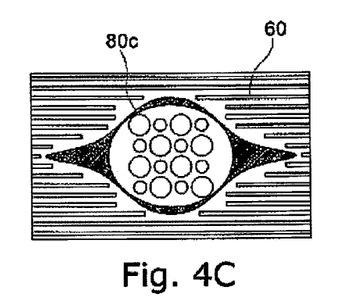
Figure 4D:
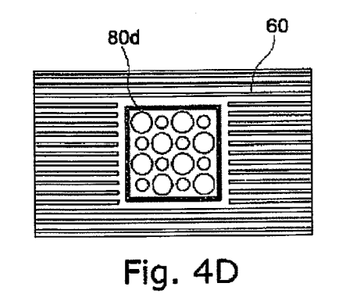

With the wind-blocking tube 80, the inner wall shape that allows emitted light to pass through may be a shape that is similar to the outer wall shape, or may be different from the outer wall shape. For example, as shown in FIG. 4C, the outer wall shape of the wind-blocking tube is the streamlined shape 80c, and the inner wall shape is elliptical. As long as the inner wall shape does not block the emitted light, it may be square or some other such polyhedral shape.

Any material may be used for the wind-blocking tube, but preferable examples include aluminum, aluminum alloys, and other such materials with excellent thermal conductivity. This allows heat to be dissipated efficiently through the wind-blocking tube, since the wind from the cooling fans is actively directed to hit the wind-blocking tube.

Figure 3D:
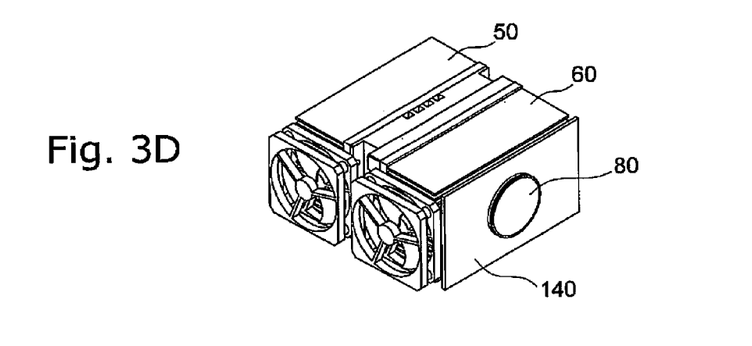
FIG. 3D is an oblique view of another embodiment of the light source device of the present disclosure.

As shown in FIG. 3D, the light source device shown in FIG. 3A can also have a cover 140 disposed further ahead of the first heat dissipation member 60. This cover 140 prevents wind from the cooling fans from flowing laterally, so the heat dissipation member can dissipate heat more efficiently. The cover 140 may be a part of the first heat dissipation member 60, or a part of the wind-blocking tube 80, or another member that covers the light source device 10. It is preferable for the wind-blocking tube 80 to be the same height as the first heat dissipation member 60 (the same length in the forward direction), and for the side walls of the protection member 90 that surrounds the optical path of the optical engine to serve as the cover 140.

FIG. 5 is a diagram illustrating the structure of the optical engine 100 of the present disclosure. The optical engine 100 includes a light conversion member 101 such as a phosphor wheel that converts the wavelength of light from the light source device 10, a light pipe or other such optical member 102 that color-mixes light emitted from a semiconductor laser device and light from the light conversion member, a micro-mirror 121, liquid crystal panel, or other such light modulation member 103 that modulates the color-mixed light, and a projection lens or other such projection member 104 that projects images and video onto a screen. Furthermore, the optical engine 100 can be replaced by, or equipped with, a reflecting mirror or another lens, a dichroic mirror, or a dichroic prism, a cross dichroic prism, a rod integrator, or another such optical part. Since commonly used semiconductor laser devices emit light with a wavelength band of 350 to 650 nm, a GaN-based semiconductor laser element is preferable, one that emits light with a wavelength band of 400 to 480 nm.

Examples of the light conversion member 101 include a phosphor wheel formed from a phosphor emitting the light including a light with 500 nm to 740 nm-dominant wavelength range. Examples of the phosphor include europium activated strontium aluminate (SAE), lutetium aluminum garnet (LAG), yttrium aluminum garnet (YAG), europium activated barium magnesium aluminate (BAM:Mn), β-sialon-based oxynitrides fluorescent material (such as $SrAl_2O_4$:Eu, $Lu_3Al_5O_{12}$:Ce, $(Y,Gd)_3(Al,Ga)_5O_{12}$:Ce, $BaMgAl_{10}O_{17}$:Eu,Mn), calcium silicon nitride (CESN), strontium silicon nitride (SESN), calcium strontium silicon nitride (SCESN), europium activated calcium aluminum nitride silicates (such as $Ca_2Si_5N_8$:Eu, $Sr_2Si_5N_8$:Eu, $(Ca,Sr)_2Si_5N_8$:Eu, $CaAlSiN_3$:Eu), and the like or a combination of at least one phosphor.

When the light conversion member 101, the optical member 102, the light modulation member 103, the projection member 104, and other optical parts are irradiated with strong light, dust and organic matter in the air may adhere to the regions irradiated by the light, which can deteriorate the reflectivity, transmissivity, and other such optical characteristics of the optical parts, and ultimately may lead to a decrease in the intensity of the light emitted by the optical engine and/or a drop in color purity.

In view of this, the optical path of the optical engine constituted by the light conversion member 101, the optical member 102, the light modulation member 103, the projection member 104, and other optical parts is preferably surrounded by the protection member 90.

Of the side walls of the protection member 90 that surround the optical engine 100, an opening 91 is formed at a suitable place where light emitted from the light source device is incident. As shown in FIG. 3C, the opening in the protection member 90 is connected to the face of the wind-blocking tube 80 on the opposite side from the face installed on the light source device. This allows the entire optical path of the light from the light source device, from the semiconductor laser devices 20 to the projection member 104, to be sealed. This reduces the accumulation of dust on the optical parts of the optical engine, so there is less decrease in the intensity of light passing through the optical engine 100 and/or drop in color purity.

Further, a method for disposing the wind-blocking tube 80 will be described.

Figure 6A:
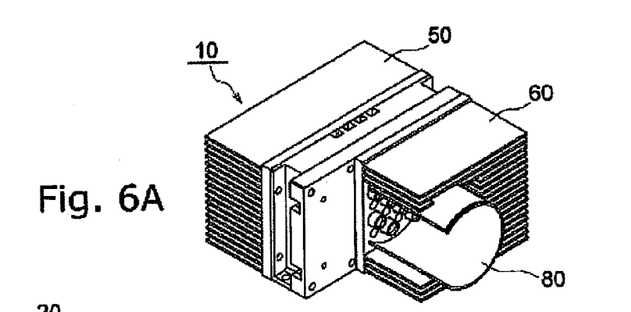
FIGS. 6A to 6G are diagrams illustrating the connection between the light source device and the wind-blocking tube of the present disclosure.
Figure 6B:
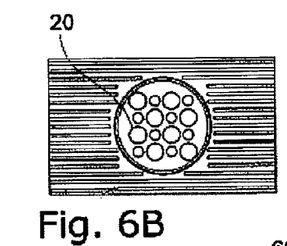
Figure 6C:
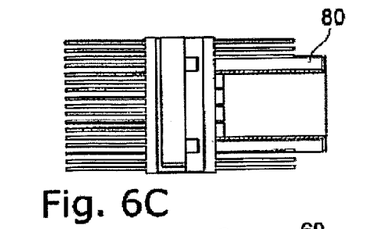

FIG. 6A is an oblique view illustrating the first heat dissipation member 60 and the wind-blocking tube 80, from which part has been cut away. FIG. 6B is a front view of FIG. 6A (as seen from the window side), and FIG. 6C is a side view illustrating the interior of FIG. 6A.

The inner wall of the wind-blocking tube 80 is preferably large enough so that all of the light from the semiconductor laser devices 20 will pass through without being blocked. As shown in FIG. 6A, if the semiconductor laser devices 20 protrude from the first heat dissipation member 60 at the window 62 of the first heat dissipation member 60, the wind-blocking tube 80 is disposed so as to surround all of the semiconductor laser devices 20.

The shape of the inner wall of the wind-blocking tube 80 preferably does not change with respect to the optical axis direction. This obviates complex machining and reduces the cost.

Figure 6D:
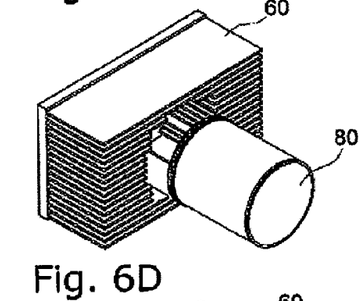

As shown in FIG. 6D, the wind-blocking tube 80 is preferably fixed to the first heat dissipation member 60 by making grooves in the first heat dissipation member 60 and the wind-blocking tube 80 and fitting one groove into the other.

Figure 6E:
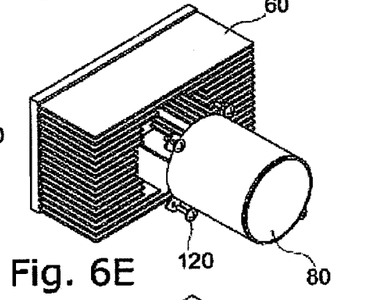

On the other hand, the fixing may be done with screws 120 as shown in FIG. 6E.

Figure 6F:
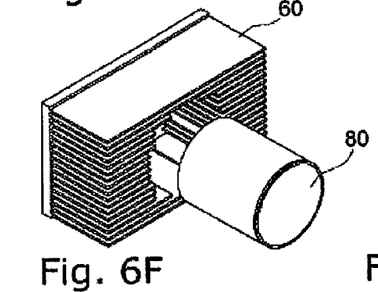

As shown in FIG. 6F, the gap between the first heat dissipation member 60 and the wind-blocking tube 80 may be filled in by contact alone.

As for the method for connecting the wind-blocking tube 80 and the protection member 90 surrounding the optical parts of the optical engine 100, the gap between the protection member 90 and the wind-blocking tube 80 may be filled in by contact alone.

Figure 7A:
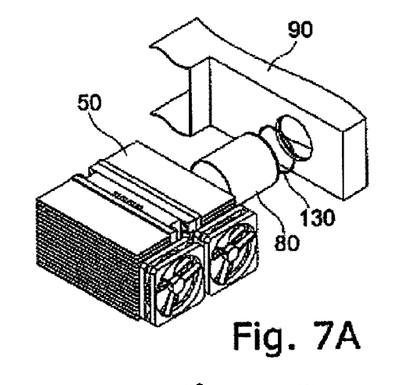
FIGS. 7A to 7E are diagrams illustrating the connection between the protection member of the optical engine and the wind-blocking tube in an embodiment of the present disclosure.
Figure 7B:
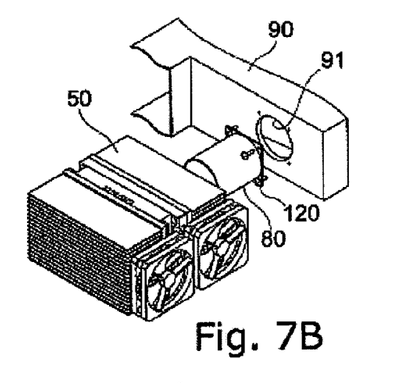
Figure 7C:
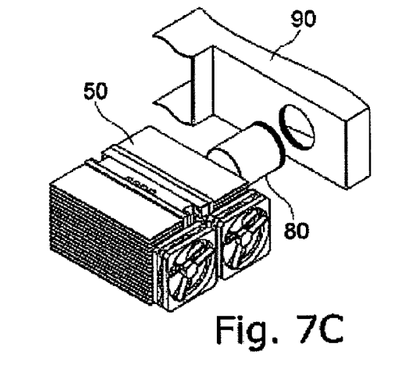
Figure 7D:
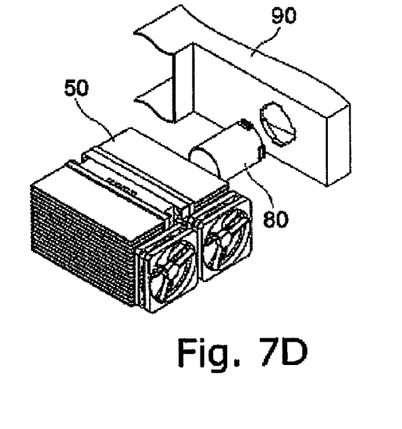

The protection member 90 and the wind-blocking tube 80 are preferably fixed by a structure in which grooves are formed in the protection member 90 and the wind-blocking tube 80 and the gap is filled in with an O-ring 130 as shown in FIG. 7A; a structure in which the protection member 90 and the wind-blocking tube 80 are fixed with the screws 120 as shown in FIG. 7B; a structure in which grooves are made in the protection member 90 and the wind-blocking tube 80 and one groove is fitted into the other as shown in FIG. 7C; or a structure in which the protection member 90 and the wind-blocking tube 80 are made to mesh together as shown in FIG. 7D.

Embodiment 2

The configuration of the light source device of Embodiment 2 is the same as the configuration of Embodiment 1, except that the method for connecting the heat dissipation member 60 and the wind-blocking tube 80 is different from that in Embodiment 1.

Figure 6G:
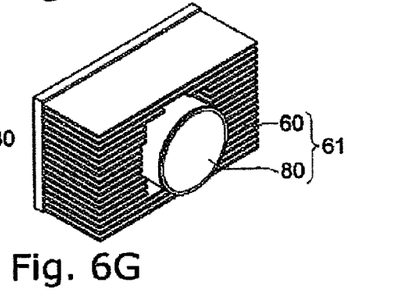

As shown in FIG. 6G, the front (light emission side) heat dissipation member (first heat dissipation member) 60 can be integrated with the wind-blocking tube 80 to create a heat dissipation member 61. This reduces the number of parts and eliminates assembly steps.

Embodiment 3

The configuration of the light source device of Embodiment 3 is the same as the configuration of Embodiment 1, except that the shape of the wind-blocking tube 80 is different from that in Embodiment 1.

Figure 8A:
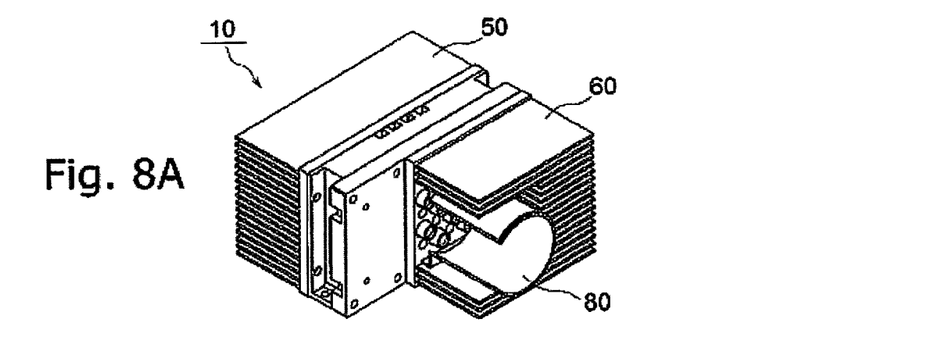
FIGS. 8A to 8E are diagrams illustrating the connection between the light source device and the wind-blocking tube of the present disclosure.
Figure 8B:
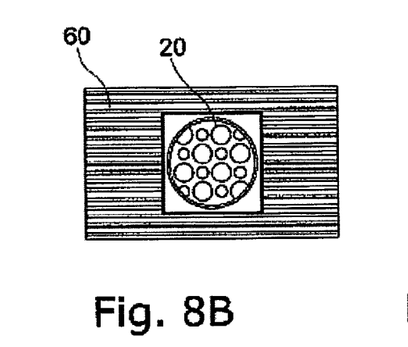
Figure 8C:
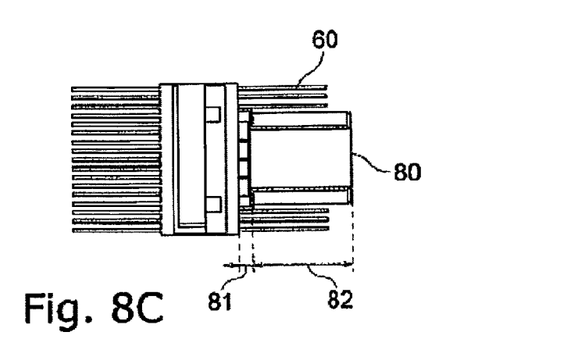
Figure 8D:
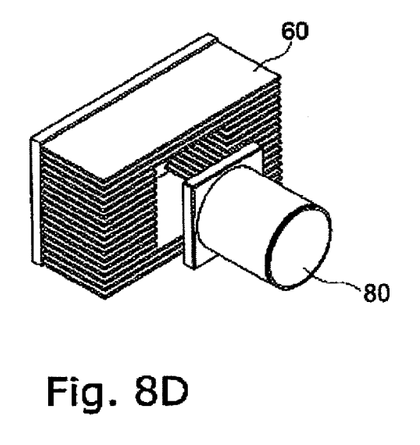
Figure 8E:
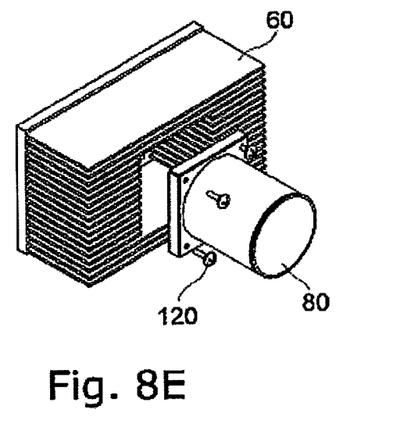

FIG. 8A is an oblique view illustrating the first heat dissipation member 60 and the wind-blocking tube 80, from which part has been cut away. FIG. 8B is a front view of FIG. 8A (as seen from the window side), and FIG. 8C is a side view illustrating the interior of FIG. 8A.

The wind-blocking tube 80 can have a multi-step structure at the window 62 of the first heat dissipation member 60. For example, as shown in FIG. 8A, the wind-blocking tube 80 has a two-step structure. The inner wall on the semiconductor laser device side serving as the first step (hereinafter referred to as the "wind-blocking tube protrusion 81") can be quadrangle in shape and have the smallest possible size that still allows it to surround all of the semiconductor laser devices 20. The outer wall and the inner wall on the opposite side from the semiconductor laser device side serving as the second step (hereinafter referred to as the "wind-blocking tube main part 82" can be circular and have the smallest possible size that still allows light from all of the semiconductor laser devices to pass through without being blocked. This embodiment is particular effective when the semiconductor laser devices 20 protrude from the first heat dissipation member 60.

Giving the wind-blocking tube 80 at least a two-step structure allows the wind-blocking tube to be more compact, and also allows the surface area of the heat dissipation member 60 to be increased, and the air resistance to be reduced, so heat dissipation is further enhanced.

The height of the wind-blocking tube protrusion 81 is preferably slightly greater than the amount by which the semiconductor laser devices 20 protrude from the heat dissipation member 60. This reduces turbulence in the wind from the cooling fans produced by the steps.

The shape of the wind-blocking tube protrusion 81 does not have to be quadrangle at both the inner and outer walls, and may be octagonal or circular, and can be changed as desired according to the number and layout of semiconductor laser devices and the shape of the heat dissipation member.

The outer wall shape of the wind-blocking tube main part 82 does not have to be circular, and may be elliptical or streamlined, with a streamlined shape being preferable. This results in lower air resistance for the wind from the cooling fans, allows heat to be dissipated more efficiently from the fins of the heat dissipation member, and reduces the occurrence of eddies in the wind.

Embodiment 4

The configuration of the light source device of Embodiment 4 is the same as the configuration of Embodiment 1, except that the method for connecting the wind-blocking tube 80 and the protection member 90 surrounding the optical parts of the optical engine 100 is different from that in Embodiment 1.

Figure 7E:
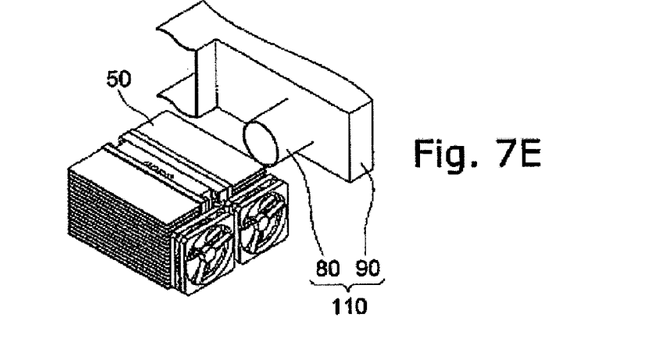

As shown in FIG. 7E, the optical engine in this embodiment can be such that the protection member 90 is integrated with the wind-blocking tube 80 to create a protection member 110. That is, the wind-blocking tube 80 becomes part of the protection member 90. This reduces the number of parts and eliminates assembly steps.

Embodiment 5

Embodiment 5 relates to the configuration of a light source device in which a semiconductor laser device that emits diverging light is installed, and the shape of the wind-blocking tube, the connection method, and the rest of the configuration is the same as in Embodiments 1 to 4.

With the light source device shown in FIG. 2B, the optical part 7 is a collimator lens or the like, whereas a semiconductor laser device 21 that is commonly used a plane window as the optical part 7 emits scattered light. If the first heat dissipation member 60 is disposed ahead of this semiconductor laser device 21, the light will be blocked. On the other hand, disposing a collimator lens or other such optical part in the wind-blocking tube 80 will allow the light emitted from the light source device to be parallel light or converged light.

Figure 9A:
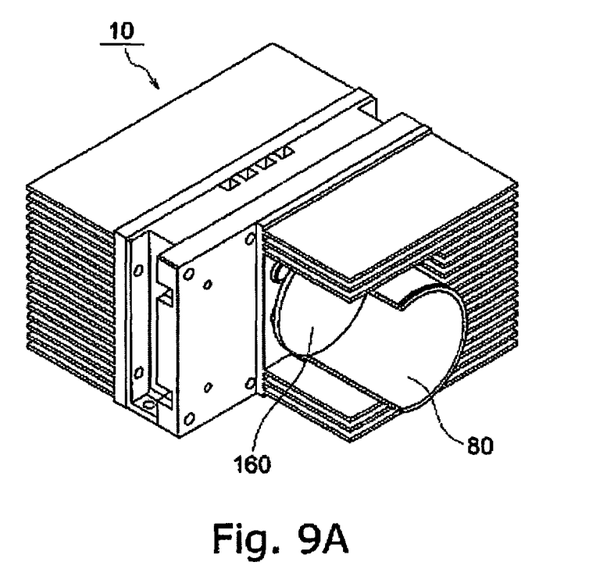
FIGS. 9A and 9B are diagrams illustrating the structure of the light source device of the embodiment of the present disclosure.
Figure 9B:
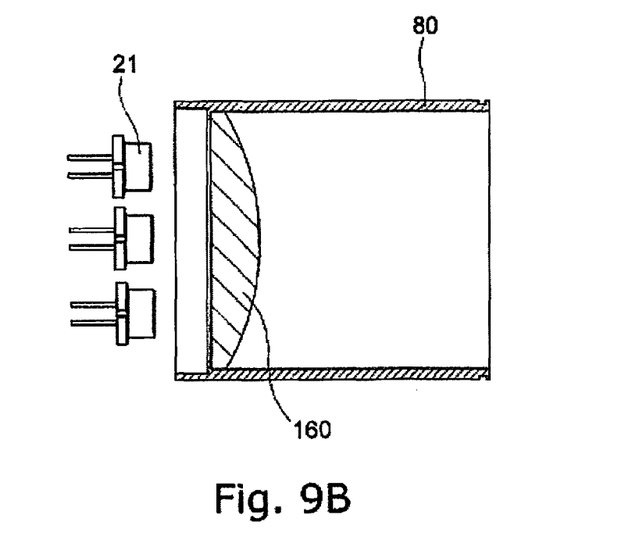

FIG. 9A is an oblique view illustrating the first heat dissipation member 60 and the wind-blocking tube 80, from which part has been cut away. FIG. 9B is a cross sectional view of a main structure from the semiconductor laser device 21 to the wind-blocking tube 80 of this embodiment.

As shown in FIGS. 9A and 9B, when a collimator lens 160 is disposed on the semiconductor laser device 21 side of the wind-blocking tube 80, it is possible to obtain parallel light or converged light inside the wind-blocking tube, so the heat dissipation performance of the semiconductor laser device 21 that emits diverging light can be improved without the light being blocked.

The optical part disposed in the interior of the wind-blocking tube 80 does not need to be a collimator lens 160, and instead one or more optical parts such as a rod integrator or a light pipe may be disposed.

The semiconductor laser device 21 may be any semiconductor laser device that emits diverging light, that is, it does not have to be a can package as shown in FIGS. 2A and 2B. Also, a plurality of semiconductor laser elements may be mounted in a single semiconductor laser device 21.

Embodiment 6

Embodiment 6 relates to a configuration of the light source device which does not have the second heat dissipation member 50 (heat dissipation member on the rear face side) and the cooling fan 70a, and the rest of the configuration is the same as in Embodiments 1 to 5.

Figure 10:
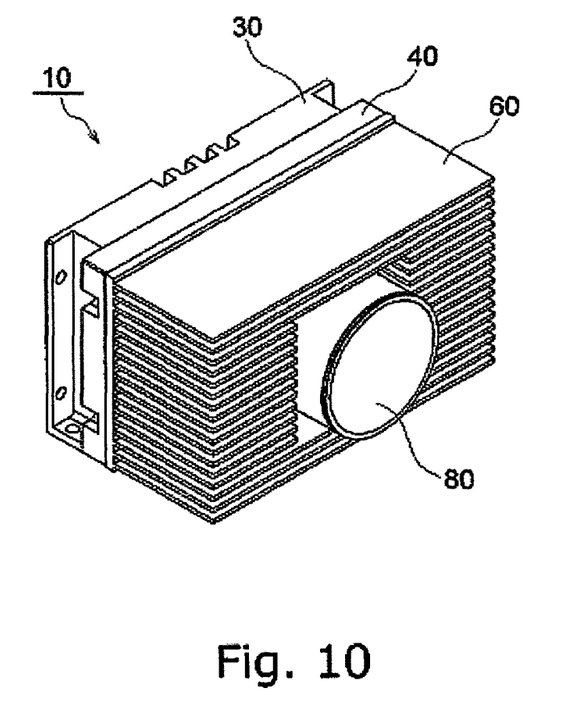
FIG. 10 is a diagram illustrating the structure of the light source device of the other embodiment of the present disclosure.

As shown in FIG. 10, heat can be dissipated from the semiconductor laser device with just the front heat dissipation member 60. This affords a more compact shape while maintaining good heat dissipation.

Embodiment 7

Embodiment 7 relates to a configuration of the light source device which includes a semiconductor laser package mounted a plurality of the semiconductor laser elements that emit light with one or more wavelength band, and the rest of the configuration is the same as in Embodiments 1 to 6.

Figure 11A:
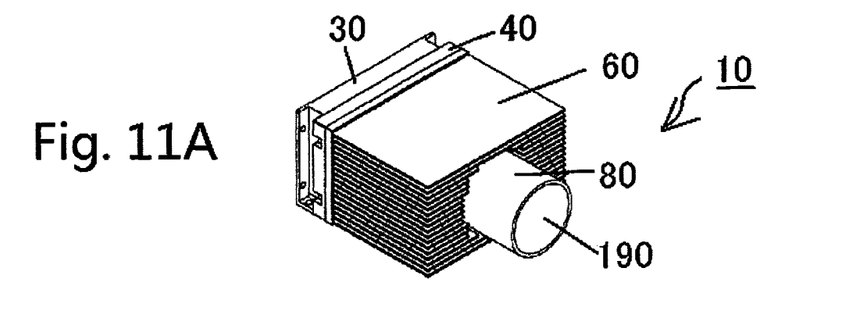
FIG. 11A is an oblique view of an embodiment of the light source device of the present disclosure.
Figure 11B:
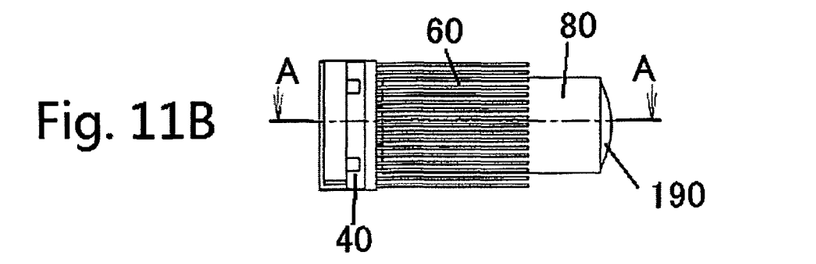
FIG. 11B is a side view of FIG. 11A.
Figure 11C:
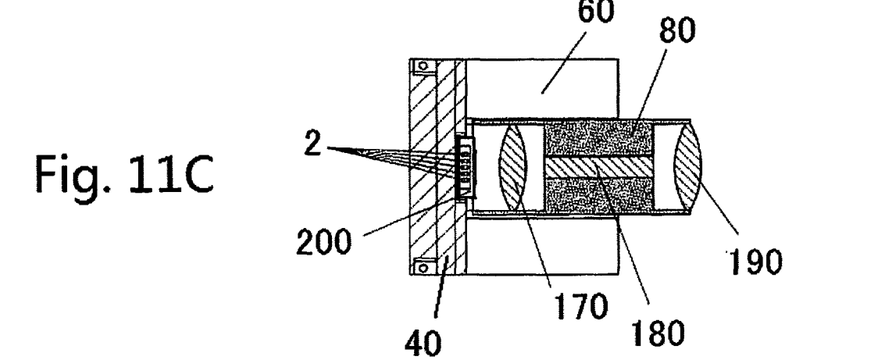
FIG. 11C is a simplified cross section along the A-A line in FIG. 11B.

As shown in FIGS. 11A to 11C, the semiconductor laser package 200 is mounted a plurality of semiconductor laser elements. The semiconductor laser elements may emit lights with the same wavelength band, or with different wavelength band.

A plurality of semiconductor laser lights which are diverging lights emitted from the semiconductor laser package 200 enter an incident face of a rod 180 through a lens 170. The semiconductor laser lights propagate inside of the rod 180, and emit from an output face of the rod 180. The lights emitted from the rod 180 emit from the wind-blocking tube 80 through a lens 190.

The lenses 170, 190 and the rod 180 disposed inside of the wind-blocking tube 80 can propagate lights inside of the wind-blocking tube 80 without light-blocking, so the semiconductor laser package 200 emitting a plurality of diverging lights with one or more wavelength band can dissipate heat more efficiently.

The lenses 170, 190 disposed inside of the wind-blocking tube 80 may be one, or more than one, respectively. A hollow light pipe may be disposed inside of the wind-blocking tube 80 instead of the rod 180 in order to propagate lights inside of the wind-blocking tube 80.

The wind-blocking tube 80 is preferably in contact with the support member 40 of the semiconductor laser package 200. Also, as long as the semiconductor light is not affected by the wind, the emitting face of the semiconductor package 200 may disposes inside the incident face of the wind-blocking tube 80.

When the semiconductor laser package 200 includes a plurality of the semiconductor laser elements emitting a plurality of diverging lights of different wavelength bands, that is, when single semiconductor laser package 200 includes a plurality of the semiconductor laser elements emitting blue light, green light, and red light, respectively, an optical engine can be provided without having a light conversion member such as a phosphor wheel. As a result, an optical engine can be provided with a reduced the number of parts and the costs.

INDUSTRIAL APPLICABILITY

The light source device of the present disclosure is used in the OPTICAL ENGINE such as projector.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A light source device comprising:
a first support member;
a second support member;
a plurality of semiconductor laser devices supported in a state of being sandwiched between the first support member and the second support member;
a heat dissipation member disposed on a light emission side of the semiconductor laser device with the second support member being disposed between the first support member and the heat dissipation member, the heat dissipation member having a single window through which light from the plurality of the semiconductor laser devices is emitted, and
a single wind-blocking tube provided inside the window.

2. The light source device according to claim 1, wherein the wind-blocking tube has a hollow structure, and the light emitted from the semiconductor laser devices pass through the interior of the wind-blocking tube.

3. The light source device according to claim 1, wherein at least one optical part is disposed in the interior of the wind-blocking tube.

4. The light source device according to claim 1, further comprising:
a cooling fan for dissipating heat from the heat dissipation member.

5. The light source device according to claim 1, wherein the wind-blocking tube has an outer wall in a cross sectional shape of a circle, an ellipse, a streamlined shape or a polygon.

6. The light source device according to claim 1, wherein the wind-blocking tube is in contact with the heat dissipation member disposed on the light emission side.

7. The light source device according to claim 1, further comprising:
a second heat dissipation member in contact with a rear face on an opposite side from the light emission side of the heat dissipation face.

8. The light source device according to claim 7, further comprising:
a second cooling fan for dissipating heat from the second heat dissipation member.

9. The light source device according to claim 7, wherein the heat dissipation member and the second heat dissipation member respectively include a plurality of fins.

10. The light source device according to claim 1, wherein each of the semiconductor laser devices has a plurality of semiconductor laser elements.

11. The light source device according to claim 1, wherein the wind-blocking tube has a rod or a light pipe in an interior thereof.

12. An optical engine, comprising:
a light source device of claim 1;
a light modulation member that modulates light emitted from the light source device;
a projection member that projects the modulated light;
a protection member surrounding an optical path of light from the light source device, the light modulation member, and the projection member, and having an opening through which light emitted from the light source device is incident,
the opening in the protection member being connected to a light emission side of the wind-blocking tube, and
the optical path being sealed from the semiconductor laser device to the projection member.

13. An optical engine, comprising:
a light source device of claim 1;
a light conversion member that emits light of a different wavelength from the wavelength of the light emitted from the light source device;
an optical member that color-mixes the light emitted from the light source device with the light emitted from the light conversion member;
a light modulation member that modulates the color-mixed light;
a projection member that projects the modulated light;
a protection member surrounding an optical path of light from the light source device, the light conversion member, the optical member, the light modulation member, and a projection member, and having an opening through which light emitted from the light source device is incident,
the opening in the protection member being connected to a light emission side of the wind-blocking tube, and
the optical path being sealed from the semiconductor laser device to the projection member.

14. An optical engine, comprising:
a light source device of claim 1;
a light conversion member that emits light of a different wavelength from the wavelength of the light emitted from the light source device;
an optical member that color-mixes the light emitted from the light source device with the light emitted from the light conversion member;
a light modulation member that modulates the color-mixed light;
a projection member that projects the modulated light;
a protection member surrounding an optical path of light from the light source device, the light conversion member, the optical member, the light modulation member, and a projection member, and having the wind-blocking tube of the light source device being part thereof; and
the optical path being sealed from the semiconductor laser device to the projection member.

* * * * *